(12) United States Patent
Yih

(10) Patent No.: US 8,043,908 B2
(45) Date of Patent: Oct. 25, 2011

(54) METHOD OF FABRICATING MEMORY

(75) Inventor: Cheng-Ming Yih, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 12/851,790

(22) Filed: Aug. 6, 2010

(65) Prior Publication Data

US 2010/0323483 A1 Dec. 23, 2010

Related U.S. Application Data

(62) Division of application No. 11/767,192, filed on Jun. 22, 2007, now Pat. No. 7,795,665.

(51) Int. Cl.
*H01L 21/8238* (2006.01)

(52) U.S. Cl. .. 438/201; 438/211; 438/593; 257/E21.179

(58) Field of Classification Search ............... 438/201, 438/211, 257, 593; 257/E21.179, E21.422, 257/E21.68
See application file for complete search history.

(56) References Cited

U.S. PATENT DOCUMENTS 5,897,354 A 4/1999 Kachelmeier ................. 438/264

OTHER PUBLICATIONS

Hang-Ting Lue et al., "BE-SONOS: A Bandgap Engineered SONOS with Excellent Performance and Reliability" Electron Devices Meeting, 2005. IEDM Technical Digest. IEEE International, Dec. 2005.
Chinese Examination Report of Taiwan Application No. 096120710, dated Aug. 30, 2010.

*Primary Examiner* — Hoai V Pham
(74) *Attorney, Agent, or Firm* — J.C. Patents

(57) ABSTRACT

A method of fabricating a semiconductor device is provided. First, a stacked structure is formed on a substrate. The stacked structure includes, from the substrate, a dielectric layer and a conductive gate in order. An ion implant process is performed to form doped regions in the substrate on the opposite sides of the stacked structure. Thereafter, source-side spacer is formed on a sidewall of the stacked structure. A thermal process is performed to activate the doped regions, thereby forming a source in the substrate under the sidewall of the stacked structure having the source-side spacer and a drain in the substrate on another side of the stacked structure.

20 Claims, 4 Drawing Sheets

METHOD OF FABRICATING MEMORY

CROSS-REFERENCE TO RELATED APPLICATION

This application is a divisional application of and claims the priority benefit of U.S. application Ser. No. 11/767,192, filed on Jun. 22, 2007, now allowed. The entirety of the above-mentioned patent application is hereby incorporated by reference herein and made a part of this specification.

BACKGROUND OF THE INVENTION

1. Field of the Invention

The present invention relates to a non-volatile memory and fabricating method thereof, and more particularly, to a flash memory having a non-symmetrical spacer structure and method of fabricating the same.

2. Description of Related Art

A typical flash memory has a floating gate and a control gate fabricated using doped polysilicon. To program data into the memory, suitable programming voltages are applied to the source, the drain and the control gate of a flash memory cell, so electrons can flow from the source to the drain through a channel. In the foregoing process, some of the electrons may penetrate through a tunneling oxide layer underneath the polysilicon floating gate and distribute evenly across the entire polysilicon gate. This phenomenon of electrons penetrating through the tunneling oxide layer into the polysilicon gate is called tunneling effect. In general, tunneling effect can be classified according to the conditions into the so-called channel hot-electron injection and the so-called Fowler-Nordheim (F-N) tunneling. Data is normally programmed into a flash memory through channel-hot electron injection and erased from the flash memory through source-side or channel area F-N tunneling.

FIGS. 1A and 1B are schematic cross-sectional views showing the process of fabricating a conventional flash memory.

As shown in FIG. 1A, a substrate is provided. Then, a tunneling oxide layer 102, a floating gate layer 104, an inter-gate dielectric layer 106 and a control gate layer 108 are sequentially formed over the substrate. Afterwards, an ion implant process 112 is performed to form a doped region 114 in the substrate 100 on the sides of the floating gate 104, respectively.

As shown in FIG. 1B, an annealing process 116 is performed to activate the doped region (refer to 114 in FIG. 1A) so that a source 118a and a drain 118b are formed in the substrate 100. The ion implant process 112 in FIG. 1A may damage a portion of the exposed edges of the tunneling oxide layer 102 and lead to degradation of the tunneling oxide layer 102 that affects the reliability of the device. Therefore, an additional thermal oxidation process is performed when the source 118a and the drain 118b are formed so that the tunneling oxide layer 102 is re-oxidized to increase the thickness of the exposed edges 102a. As a result, the tunneling oxide layer is re-strengthened and electrical stress in this region is reduced.

However, as shown in FIG. 1B, thickness $t_{edge}$ at the edge of the tunneling oxide layer 102 or the inter-gate dielectric layer 106 is thicker than thickness $t_{center}$ at the center. This difference in thickness is a big disadvantage to control of the gate-coupling ratio (GCR) between the floating gate and the control gate and may affect the operating voltage and speed of the device. Furthermore, the area between the tunneling oxide layer 102 and the channel (that is, the area between the source 118a and the drain 118b) is related to the erase operation of the flash memory. The increased edge thickness of the tunneling oxide layer 102 is also a big disadvantage to the erasing operation provided by the device.

SUMMARY OF THE INVENTION

Accordingly, the present invention is directed to a flash memory being able to improve control of a gate-coupling ratio (GCR).

The present invention is further directed to a method of fabricating a flash memory capable of preventing a re-oxidation of source-side oxide layers, thereby avoiding a thickening of the source-side oxide layer (that is, tunneling oxide layer and inter-gate dielectric layer).

To achieve these and other advantages and in accordance with the purpose of the invention, as embodied and broadly described herein, the invention provides a flash memory. The flash memory comprises a substrate, a stacked structure over the substrate, a source, a drain and a source-side spacer. The stacked structure at least includes a tunneling oxide layer, a floating gate on the tunneling oxide layer, an inter-gate dielectric layer on the floating gate and a control gate on the inter-gate dielectric layer. The source and the drain are disposed in the substrate on the sides of the floating gate, respectively. The source-side spacer is disposed on a sidewall of the stacked structure near the source, thereby preventing the tunneling oxide layer and the inter-gate dielectric layer close to the source from being re-oxidized.

According to the flash memory in an embodiment of the present invention, the foregoing source-side spacer further covers a top portion of the stacked structure.

According to the flash memory in an embodiment of the present invention, the foregoing source-side spacer further covers a surface of the substrate.

According to the flash memory in an embodiment of the present invention, the flash memory further includes a pair of memory spacers disposed on the source-side spacer and a sidewall of the stacked structure close to the drain, respectively.

According to the flash memory in an embodiment of the present invention, the material constituting the tunneling oxide layer is selected from a group consisting of oxide, nitride, nitride/oxide composite and oxide/nitride/oxide composite. For example, the tunneling oxide layer includes a bandgap engineered tunneling structure. The bandgap engineered tunneling structure is a bottom silicon oxide layer/intermediate silicon nitride layer/top silicon oxide layer structure for example.

According to the flash memory in an embodiment of the present invention, a thickness of the bottom silicon oxide layer of the bandgap engineered tunneling structure is selected from the following three ranges: less than or equal to 20 Å, between about 5 Å to 20 Å, or less than or equal to 15 Å.

According to the flash memory in an embodiment of the present invention, a thickness of the silicon nitride layer of the bandgap engineered tunneling structure is selected from the following two ranges: less than or equal to 20 Å or between about 10 Å to 20 Å.

According to the flash memory in an embodiment of the present invention, a thickness of the top silicon oxide layer of the bandgap engineered tunneling structure is less than or equal to 20 Å, for example.

The present invention also provides a method of fabricating a memory. First, a stacked structure is formed on a substrate. The stacked structure includes, sequentially from the substrate, a tunneling layer, a dielectric layer and a control gate layer in order. Then, an ion implant process is performed to form a doped region in the substrate on the opposite sides of the stacked gate, respectively. Next, a source-side spacer is formed on a sidewall of the stacked structure. After that, a thermal process is performed to activate the foregoing doped region, thereby forming a source in the substrate underneath the sidewall of the stacked structure having the source-side spacer and a drain in the substrate underneath another side of the stacked structure.

According to the method in an embodiment of the present invention, the foregoing thermal process includes an oxidation process or an annealing process.

According to the method in an embodiment of the present invention, the foregoing method of forming the source-side spacer includes covering the surface of the stacked structure with an oxidation-prevention layer and removing the oxidation-prevention layer above the sidewall of the stacked structure close to the drain.

According to the method in an embodiment of the present invention, after performing the thermal process, further includes forming a pair of memory spacers on the source-side spacer and a sidewall of the stacked structure close to the drain, respectively.

According to the method in an embodiment of the present invention, the material constituting the tunneling oxide layer is selected from a group consisting of oxide, nitride, nitride/oxide composite and oxide/nitride/oxide composite.

According to an embodiment of the present invention, the foregoing source-side spacer has a thickness between 75 Å to 200 Å.

According to an embodiment of the present invention, the material constituting the foregoing source-side spacer includes silicon nitride or silicon oxynitride.

According to an embodiment of the present invention, the stacked structure further comprises a floating gate located between the tunneling layer and the dielectric layer. The material constituting the floating gate includes doped polysilicon.

According to an embodiment of the present invention, the material constituting the foregoing inter-gate dielectric layer is selected from a group consisting of oxide, nitride, nitride/oxide composite and oxide/nitride/oxide composite.

According to an embodiment of the present invention, the material constituting the control gate is selected from a group consisting of doped polysilicon, metal silicide and conductive metal.

A method of fabricating a semiconductor device is also provided. First, a stacked structure is formed on a substrate. The stacked structure includes, from the substrate, a dielectric layer and a conductive gate in order. An ion implant process is performed to form doped regions in the substrate on the opposite sides of the stacked structure. Thereafter, source-side spacer is formed on a sidewall of the stacked structure. A thermal process is performed to activate the doped regions, thereby forming a source in the substrate under the sidewall of the stacked structure having the source-side spacer and a drain in the substrate on another side of the stacked structure.

According to the method in an embodiment of the present invention, the thermal process includes a thermal oxidation process or an annealing process.

According to the method in an embodiment of the present invention, the step of forming the source-side spacer includes covering an oxidation-prevention layer on a surface of the stacked structure; and removing the oxidation-prevention layer on a sidewall of the stacked structure close to the drain.

According to the method in an embodiment of the present invention, the source-side spacer has a thickness between about 75 Å to 200 Å.

According to the method in an embodiment of the present invention, the material constituting the source-side spacer includes silicon nitride or silicon oxynitride.

According to the method in an embodiment of the present invention, after the thermal process is performed, a pair of memory spacers is formed on the source-side spacer and on another sidewall of the stacked structure close to the drain.

According to the method in an embodiment of the present invention, the material constituting the dielectric layer is selected from a group consisting of oxide, nitride, nitride/oxide composite and oxide/nitride/oxide composite.

According to the method in an embodiment of the present invention, the material constituting the conductive gate is selected from a group consisting of doped polysilicon, metal silicide and conductive metal.

A method of fabricating a semiconductor device is still provided. First, a stacked structure is formed on a substrate, wherein the stacked structure includes, from the substrate, a dielectric layer and a conductive gate in order. Doped regions are formed in the substrate on the opposite sides of the stacked structure. A first spacer is formed on a sidewall of the stacked structure and exposing a sidewall of the stacked structure. A thermal process is performed to form an uneven surface of the substrate.

According to the method in an embodiment of the present invention, after the thermal process is performed, a pair of other spacers is formed on the spacer and on an exposed surface of the foregoing another sidewall of the stacked structure.

Due to the formation of a source-side spacer with oxidation-prevention capability close to the source, the thickness at the edge of the tunneling oxide layer and the inter-gate dielectric layer close to the source remains unchanged. Hence, control of the gate-coupling ratio (GCR) between the floating gate and the control gate is improved, thereby improving the memory erase capacity. Moreover, the isolating capability of the source-side spacer not only eliminates the memory cell dislocation, but also improves the retention capacity of memory data.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
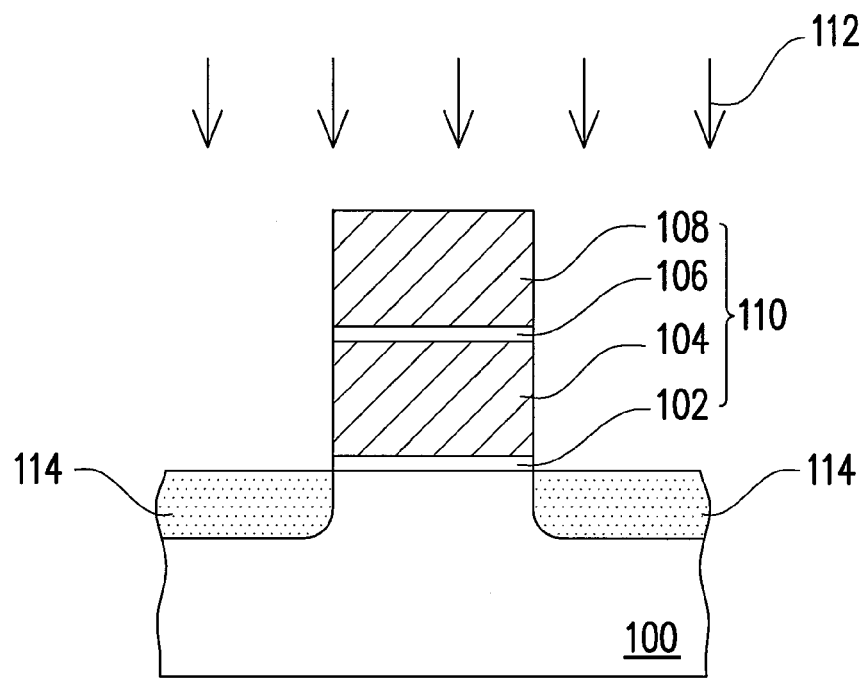
FIGS. 1A and 1B are schematic cross-sectional views showing the process of fabricating a conventional flash memory.
Figure 1B:
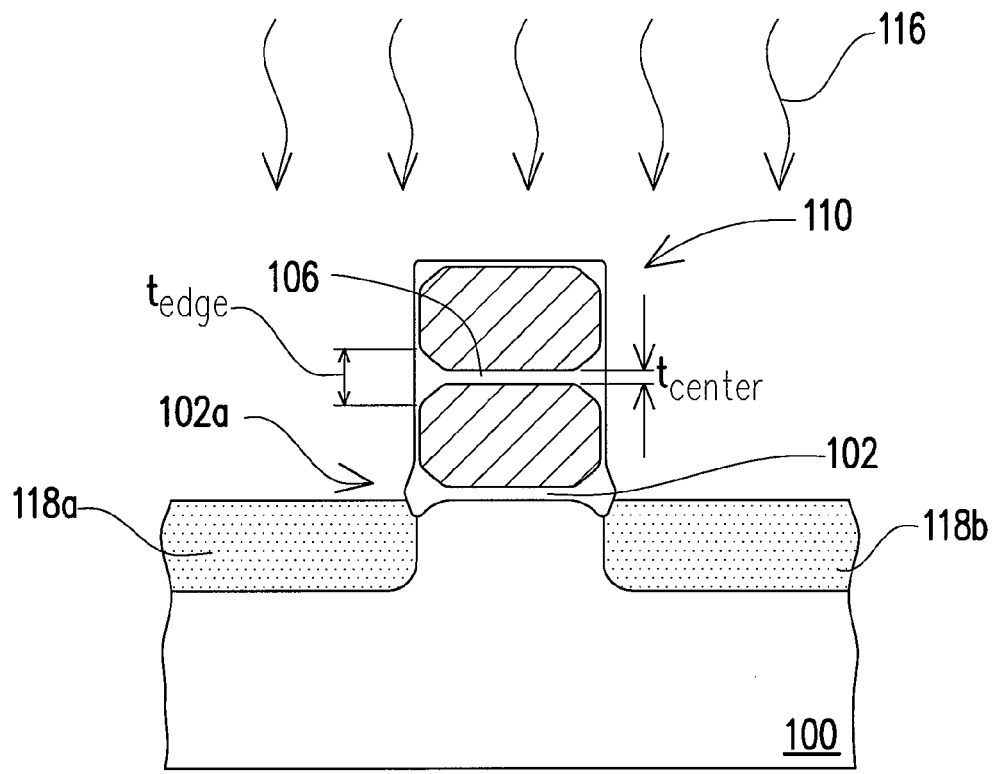

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2E are schematic cross-sectional views showing the process for fabricating a flash memory according to one preferred embodiment of the present invention.

Figure 2A:
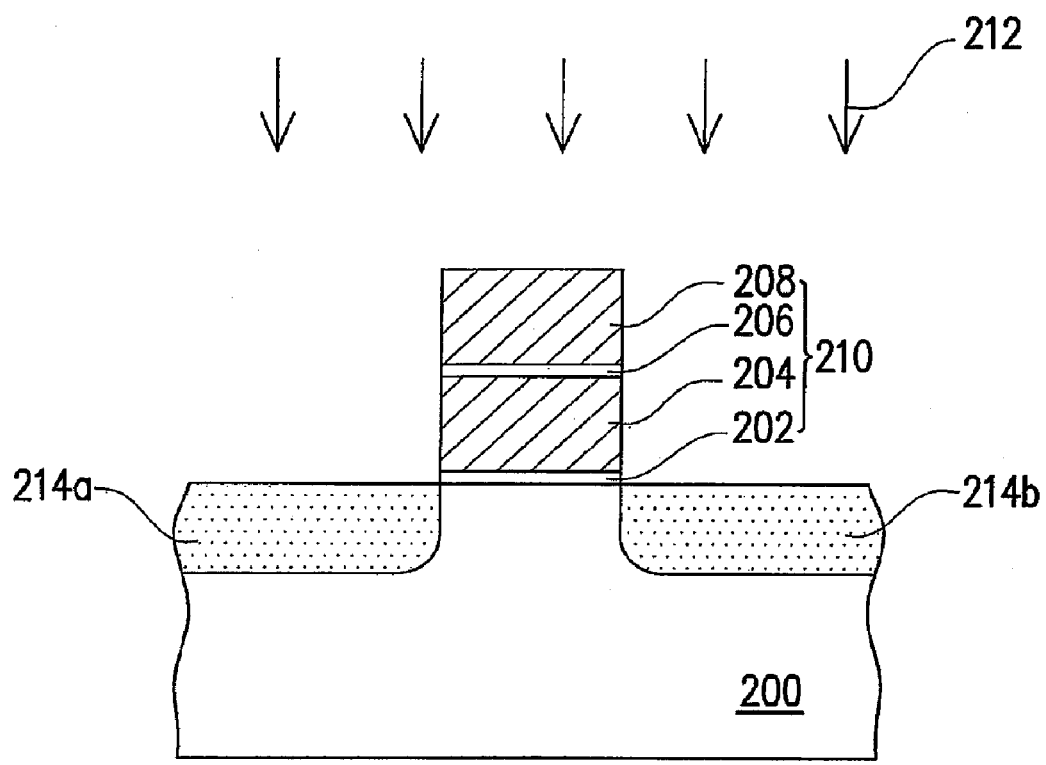
FIGS. 2A through 2E are schematic cross-sectional views showing the process for fabricating a flash memory according to one preferred embodiment of the present invention.

As shown in FIG. 2A, a stacked structure 210 is formed on a substrate 200. The stacked structure 210 includes, for example, sequentially from the substrate 200, a tunneling oxide layer 202, a floating gate 204, an inter-gate dielectric layer 206 and a control gate 208. The material constituting the floating gate 204 includes, for example, doped polysilicon. The material constituting the inter-gate dielectric layer 206 and the tunneling oxide layer 202 are independently, for example, selected from a group consisting of oxide, nitride, nitride/oxide composite and oxide/nitride/oxide composite. The material constituting the control gate 208 is, for example, selected from a group consisting of doped polysilicon, metal silicide and conductive metal. In addition, aside from the one shown in the FIG. 2A, the stacked structure 210 may include other film layers such as a capping layer. Additionally, the tunneling oxide layer 202 may be a bandgap engineered tunneling structure such as a silicon oxide/silicon nitride/silicon oxide (ONO) structure, for example. In one embodiment, a thickness of the bottom silicon oxide layer of the ONO stacked structure, for example, is selected from the following three ranges: less than or equal to 20 Å, between about 5 Å to 20 Å, or less than or equal to 15 Å; a thickness of the intermediate silicon nitride layer is selected from the following two ranges: less than or equal to 20 Å or between about 10 Å to 20 Å; and a thickness of the top silicon oxide layer is less than or equal to 20 Å such as between about 15 Å to 20 Å.

Again, as shown in FIG. 2A, an ion implant process 212 is performed to form doped regions 214a and 214b in the substrate 200 on the sides of the floating gate 204, respectively. To simplify the explanation, the doped region 214a is an area for subsequently forming a source region and the doped region 214b is an area for subsequently forming a drain region.

Figure 2B:
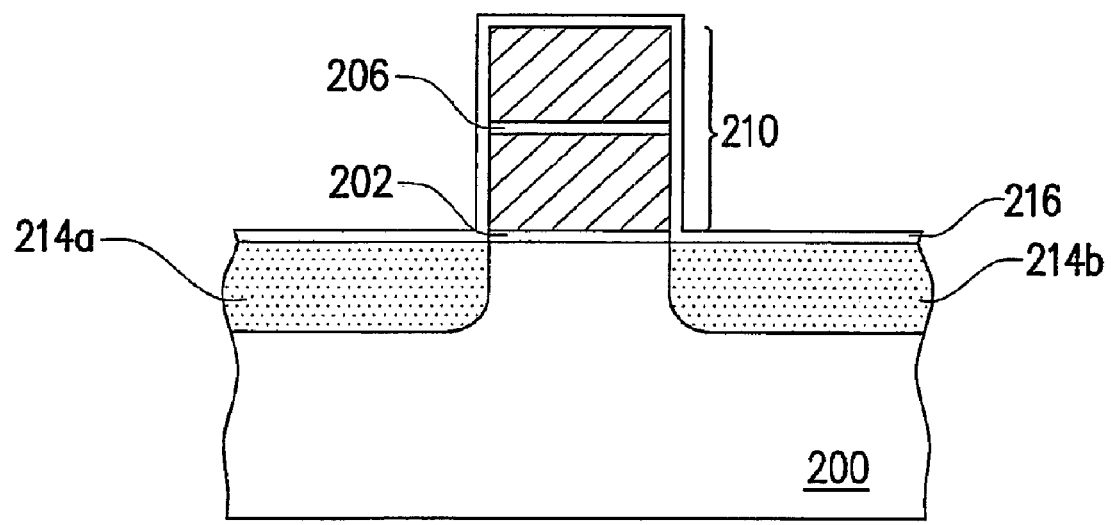

Next, as shown in FIG. 2B, a source-side spacer is formed over the sidewall of the stacked structure 210 to prevent possible oxidation of the tunneling oxide layer 202 and the inter-gate dielectric layer 206 in an area close to the subsequently formed source (the doped region 214a). Therefore, a chemical vapor deposition process can be performed to form an oxidation-prevention layer 216 to cover the surface of the stacked structure 210. The so-called 'oxidation-prevention layer' is a material layer capable of preventing and suppressing the covered or shielded material from being oxidized. Obviously, the oxidation-preventing layer 216 also covers the surface of the substrate 200.

Figure 2C:
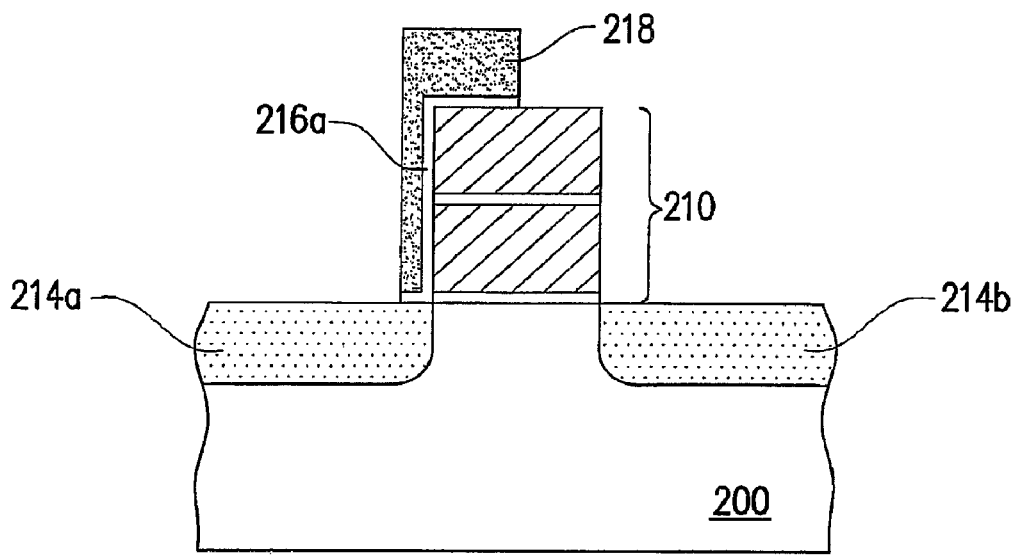

As shown in FIG. 2C, the oxidation-prevention layer 216 above the sidewall of the stacked structure 210 close to the subsequently formed drain region (the doped region 214b) needs to be removed (refer to FIG. 2B). For example, a photolithography process is performed to form a patterned photoresist 218 on the substrate 200 so that the oxidation-prevention layer 216 on the sidewall close to the doped region 214a is covered. Then, an etching process is performed to remove the exposed oxidation-prevention layer 216 and obtain a source-side spacer 216a. The source-side spacer 216a has a thickness between about 75 Å to 200 Å, for example. The material constituting the foregoing source-side spacer 216a includes, for example, silicon nitride or silicon oxynitride. A portion of the source-side spacer 216a may cover part of the top portion of the stacked structure 210 or a portion of the surface of the substrate 200. Moreover, due to the isolating capability of the source-side spacer 216a, the memory cell dislocation is eliminated and the retention capacity of memory data is improved.

Figure 2D:
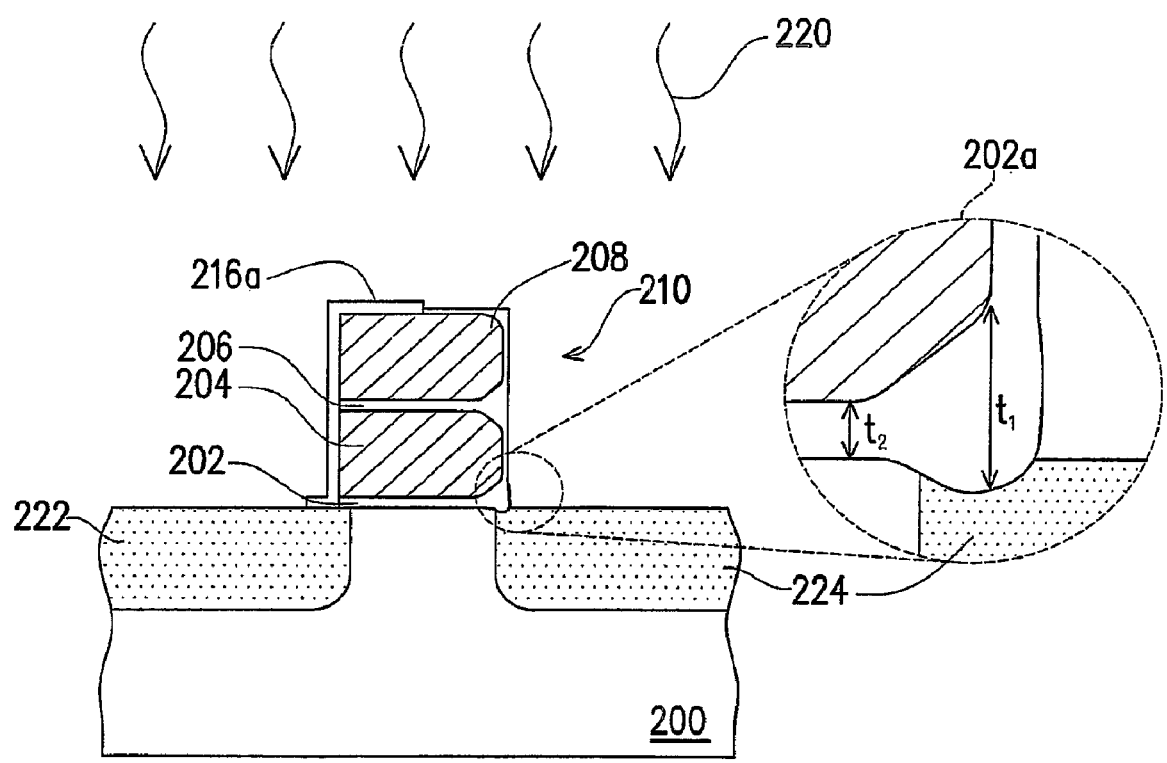

As shown in FIG. 2D, the patterned photoresist layer 218 (refer to FIG. 2C) is removed. Then, a thermal process 220 is performed to activate the doped regions 214a and 214b (refer to FIG. 2C). Hence, a source 222 is formed in the substrate 200 underneath the sidewall of the stacked structure 210 next to the source-side spacer 216a and a drain 224 is formed in the substrate 200 on another side of the stacked structure 210. The foregoing thermal process 220 includes, for example, an annealing process. Alternatively, because the ion implant process 212 performed as shown FIG. 2A may damage the exposed side edge 202a of the tunneling oxide layer 202 and lead to degradation of the tunneling oxide layer 202 that may affect the reliability of the device, the thermal process 220 can be a thermal oxidation process so that the thickness $t_1$ at the side edge of the tunneling oxide layer 202 close to the drain 224 is thicker than the central thickness $t_2$. As a result, the operation of the device is able to avoid this region. Moreover, after the thermal process 220, due to the protection of the source-side spacer 216, there is no change in the edge thickness of the tunneling oxide layer 202 and the inter-gate dielectric layer 206 close to the source 222. Consequently, control of the gate-coupling ratio (GCR) between the floating gate 204 and the control gate 208 is improved. Furthermore, because the thickness of the tunneling oxide layer 202 close to the source 222 remains unchanged, the erase capacity of the flash memory is enhanced.

Figure 2E:
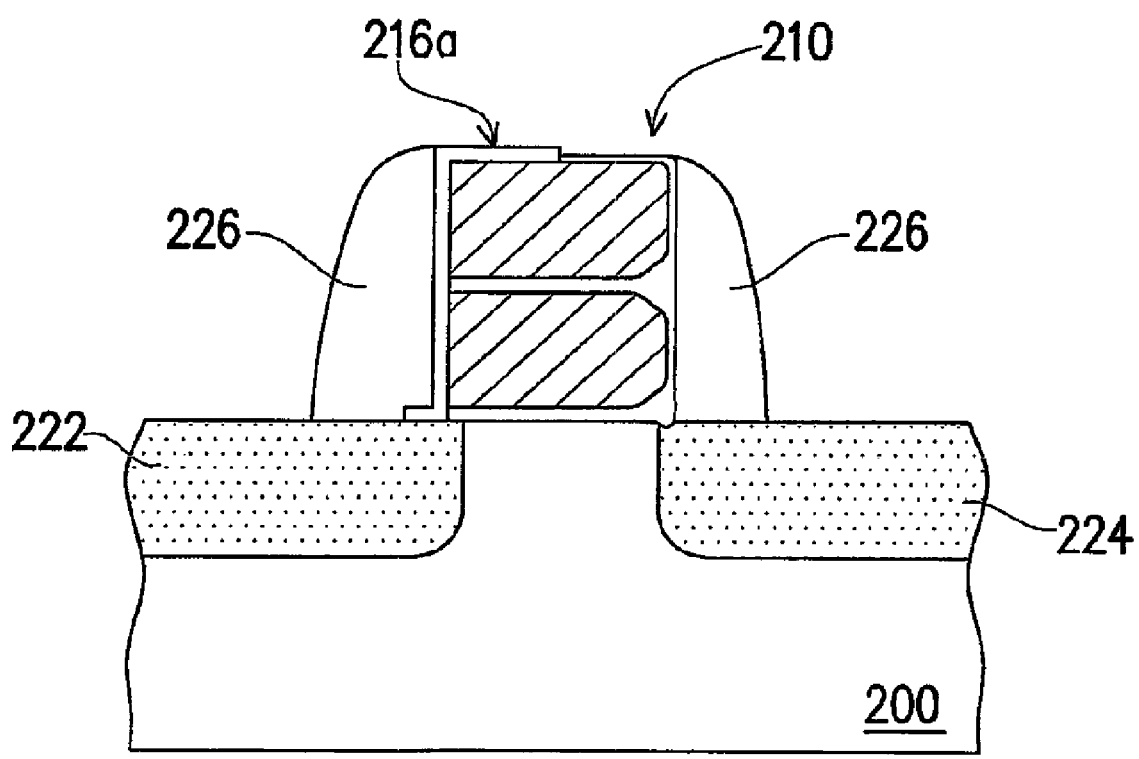

As shown in FIG. 2E, before forming contacts (not shown) around the flash memory of the present embodiment in a subsequent operation, a pair of symmetrical memory spacers 226 may be formed on the source-side spacer 216a and on the sidewall of the stacked structure 210 close to the drain 224 to protect the stacked structure 210.

In summary, one principal aspect of the present invention is the formation of a protective source-side spacer close to the source so that thickness at the edge of the tunneling oxide layer and the inter-gate dielectric layer close to the source remains unchanged. Hence, control of the gate-coupling ratio (GCR) between the floating gate and the control gate is improved. Moreover, with the thickness of the tunneling oxide layer remaining unchanged close to the source, the memory erase capacity is also improved. In addition, due to the isolating capability of the source-side spacer, the memory cell dislocation is eliminated and the retention capacity of memory data is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A method of fabricating a memory, comprising:
    forming a stacked structure on a substrate, wherein the stacked structure comprises, from the substrate, a tunneling layer, a dielectric layer and a control gate in order;
    performing an ion implant process to form a doped region in the substrate on the opposite sides of the stacked gate;
    forming a source-side spacer on a sidewall of the stacked structure; and
    performing a thermal process to activate the doped regions and to oxidize the substrate and the stacked structure, thereby forming a source in the substrate under the sidewall of the stacked structure having the source-side spacer and a drain in the substrate on another side of the stacked structure and forming an asymmetry tunnel layer.

2. The method of claim 1, wherein the thermal process includes a thermal oxidation process or an annealing process.

3. The method of claim 1, wherein the step of forming the source-side spacer comprises:
covering an oxidation-prevention layer on a surface of the stacked structure; and
removing the oxidation-prevention layer on a sidewall of the stacked structure close to the drain.

4. The method of claim 1, wherein the source-side spacer has a thickness between about 75 Å to 200 Å.

5. The method of claim 1, wherein the material constituting the source-side spacer comprises silicon nitride or silicon oxynitride.

6. The method of claim 1, wherein, after performing the thermal process, further comprises forming a pair of memory spacers on the source-side spacer and on a sidewall of the stacked structure close to the drain.

7. The method of claim 1, wherein the stacked structure further comprises a floating gate located between the tunneling layer and the dielectric layer.

8. The method of claim 7, wherein the material constituting the floating gate comprises doped polysilicon.

9. The method of claim 1, wherein the material constituting the dielectric layer is selected from a group consisting of oxide, nitride, nitride/oxide composite and oxide/nitride/oxide composite.

10. The method of claim 1, wherein the material constituting the control gate is selected from a group consisting of doped polysilicon, metal silicide and conductive metal.

11. A method of fabricating a semiconductor device, comprising:
forming a stacked structure on a substrate, wherein the stacked structure comprises, from the substrate, a dielectric layer and a conductive gate in order;
performing an ion implant process to form a doped region in the substrate on the opposite sides of the stacked structure;
forming a source-side spacer on a sidewall of the stacked structure; and
performing a thermal process to activate the doped regions and to oxidize the substrate and the stacked structure, thereby forming a source in the substrate under the sidewall of the stacked structure having the source-side spacer and a drain in the substrate on another side of the stacked structure and forming an asymmetry dielectric layer.

12. The method of claim 11, wherein the thermal process includes a thermal oxidation process or an annealing process.

13. The method of claim 11, wherein the step of forming the source-side spacer comprises:
covering an oxidation-prevention layer on a surface of the stacked structure; and
removing the oxidation-prevention layer on a sidewall of the stacked structure close to the drain.

14. The method of claim 11, wherein the source-side spacer has a thickness between about 75 Å to 200 Å.

15. The method of claim 11, wherein the material constituting the source-side spacer comprises silicon nitride or silicon oxynitride.

16. The method of claim 11, wherein, after performing the thermal process, further comprises forming a pair of memory spacers on the source-side spacer and on another sidewall of the stacked structure close to the drain.

17. The method of claim 11, wherein the material constituting the dielectric layer is selected from a group consisting of oxide, nitride, nitride/oxide composite and oxide/nitride/oxide composite.

18. The method of claim 11, wherein the material constituting the conductive gate is selected from a group consisting of doped polysilicon, metal silicide and conductive metal.

19. A method of fabricating a semiconductor device, comprising:
forming a stacked structure on a substrate, wherein the stacked structure comprises a dielectric layer and a conductive gate;
forming a doped region in the substrate on the opposite sides of the stacked structure;
forming a spacer on a sidewall of the stacked structure and exposing another sidewall of the stacked structure; and
performing a thermal process to form an uneven surface of the substrate.

20. The method of claim 19, wherein, after performing the thermal process, further comprises forming a pair of other spacers on the spacer and on an exposed surface of the said another sidewall of the stacked structure.

* * * * *